(12) United States Patent
McCarthy et al.

(10) Patent No.: US 6,861,092 B2
(45) Date of Patent: *Mar. 1, 2005

(54) LOW SIGNAL LOSS BONDING PLY FOR MULTILAYER CIRCUIT BOARDS

(75) Inventors: Thomas F. McCarthy, Bennington, VT (US); David L. Wynants, Sr., Cambridge, NY (US)

(73) Assignee: Tonoga, Inc., Petersburg, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/289,984

(22) Filed: Nov. 7, 2002

(65) Prior Publication Data

US 2003/0072929 A1 Apr. 17, 2003

Related U.S. Application Data

(62) Division of application No. 09/952,486, filed on Sep. 14, 2001, now Pat. No. 6,500,529.

(51) Int. Cl.$^7$ ................................................. B05D 5/10
(52) U.S. Cl. .................... 427/207.1; 427/208; 428/209; 428/297.4; 428/344; 174/258; 174/259
(58) Field of Search ................ 428/209, 297.4, 428/344, 901; 427/207.1, 208; 174/258, 259

(56) References Cited

U.S. PATENT DOCUMENTS

| | | | |
|---|---|---|---|
| 2,932,599 A | 4/1960 | Dahlgren | |
| 2,955,974 A | 10/1960 | Allen et al. | |
| 3,606,677 A | 9/1971 | Ryan | |
| 3,649,475 A | 3/1972 | Degnan et al. | |
| 4,403,653 A * | 9/1983 | Davidson | 428/379 |
| 4,680,220 A | 7/1987 | Johnson | 428/241 |
| 4,784,901 A * | 11/1988 | Hatakeyama et al. | 428/268 |
| 4,849,284 A | 7/1989 | Arthur et al. | 428/331 |
| 4,886,699 A | 12/1989 | Carroll et al. | 428/228 |
| 4,902,556 A | 2/1990 | Benedikt et al. | 428/209 |
| 5,001,010 A | 3/1991 | Chao et al. | 428/417 |
| 5,043,367 A | 8/1991 | Hallgren et al. | 523/429 |
| 5,108,842 A | 4/1992 | Hallgren et al. | 523/416 |
| 5,141,791 A | 8/1992 | Chao et al. | 428/209 |
| 5,162,450 A | 11/1992 | Chao et al. | 525/396 |
| 5,213,886 A | 5/1993 | Chao et al. | 428/288 |
| 5,214,571 A | 5/1993 | Dahlgren et al. | 361/414 |
| 5,218,030 A | 6/1993 | Katayose et al. | 524/371 |
| 5,250,347 A | 10/1993 | Mehta et al. | 428/209 |
| 5,352,745 A | 10/1994 | Katayose et al. | 525/391 |
| 5,538,756 A | 7/1996 | Koreleski et al. | 428/317.9 |
| 5,571,609 A * | 11/1996 | St. Lawrence et al. | 442/234 |
| 5,635,293 A | 6/1997 | Korleski et al. | 427/207.1 |
| 5,652,055 A | 7/1997 | King et al. | 428/343 |
| 6,929,518 | 7/1999 | Schlaiss | 257/712 |
| 6,066,386 A | 5/2000 | Boyko et al. | 428/209 |
| 6,108,903 A * | 8/2000 | Nakatani et al. | 29/852 |
| 6,254,972 B1 | 7/2001 | Farquhar et al. | 428/209 |
| 6,291,374 B1 * | 9/2001 | Landi | 442/237 |
| 6,388,204 B1 | 5/2002 | Lauffer et al. | |
| 6,500,529 B1 | 12/2002 | McCarthy et al. | |

FOREIGN PATENT DOCUMENTS

| | | |
|---|---|---|
| EP | 0 334 499 | 9/1989 |
| EP | 1 117 281 A1 | 7/2001 |
| GB | 2 109 166 A | 5/1993 |
| JP | 60 235844 | 11/1985 |
| JP | 63-081 139 | 4/1988 |
| JP | 02-245 330 | 1/1990 |
| JP | 03-110158 | 5/1991 |
| JP | 6-322157 | 11/1994 |
| JP | 11-112 147 | 4/1999 |
| WO | WO 03/026371 | 3/2003 |

OTHER PUBLICATIONS

Frankosky, J., *Processing PTFE/Clad PCBS*, Printed Circuit Fabrication, vol. 15, No. 11, Nov. 1992, pp. 22, 25.
U.S. Appl. No. 10/448,081, Filed May 29, 2003, *Low Signal Loss Bonding Ply for Multilayer Circuit Boards* to McCarthy et al. (Our Ref No.: 1350.069B).

* cited by examiner

*Primary Examiner*—Cathy F. Lam
(74) *Attorney, Agent, or Firm*—Heslin Rothenberg Farley & Mesiti P.C.; Mary Louise Gioeni, Esq.

(57) ABSTRACT

A process for fabricating a low loss multilayer printed circuit board using a bonding ply comprising a fluoropolymer composite substrate and a thermosetting adhesive composition is disclosed. The fluoropolymer composite comprises at least one fluoropolymer and a substrate selected from woven fabrics, nonwoven fabrics and polymeric films.

3 Claims, 5 Drawing Sheets

Schematic of a PWB core laminate comprising a PTFE Coated Fiberglass Composite having a Thermosetting Resin Surface Coating for Low Temperature Lamination and Copper Cladding.

FIG. 1

Schematic of a PTFE Coated Fiberglass Composite having a Thermosetting Resin Surface Coating for Low Temperature Lamination.

FIG. 2

4 Layer Hybrid Printed Circuit Board Manufactured using a PTFE Coated, 7628 Style Fiberglass, Surface Coated Thermosetting Resin, Composite as the Bond Ply.

FIG. 3

4 Layer Hybrid Printed Circuit Board Manufactured using a PTFE Coated, 7628 Style Fiberglass, Surface Coated Thermosetting Resin, Composite as the Bond Ply.

FIG. 4

4 Layer Hybrid Printed Circuit Board Manufactured using a PTFE Coated, 106 Style Fiberglass, Surface Coated Thermosetting Resin, Composite as the Bond Ply.

FIG. 5

Schematic of a PWB core laminate comprising a PTFE Coated Fiberglass Composite having a Thermosetting Resin Surface Coating for Low Temperature Lamination and Copper Cladding.

LOW SIGNAL LOSS BONDING PLY FOR MULTILAYER CIRCUIT BOARDS

CROSS-REFERENCE TO RELATED APPLICATIONS

This application is a Divisional of U.S. patent application Ser. No. 09/952,486, filed Sep. 14, 2001 now U.S. Pat. No. 6,500,529, entitled LOW SIGNAL LOSS BONDING PLY FOR MULTILAYER CIRCUIT BOARDS, the priority of which is claimed herein, and the entire disclosure of which is incorporated herein by reference.

FIELD OF THE INVENTION

This invention relates to a multilayer bonding prepreg comprising a fluoropolymer, a substrate typically consisting of fiberglass to reinforce the low signal loss fluoropolymer, a surface coated thermosetting resin and optionally a ceramic filler to control the coefficient of thermal expansion. Ceramic filler is used in either the fluoropolymer coated glass component, the thermosetting resin surface component, or in both components. The composite is used as a low signal loss bonding ply which can be pressed at low temperatures to manufacture a multilayer circuit board for high frequency applications

BACKGROUND OF THE INVENTION

In the electronics industry multilayer circuit boards are prepared by bonding a layer of incompletely cured thermosetting resin reinforced with fiberglass between layers of a fully cured print and etched laminate. For a four-layer epoxy based circuit board, first an epoxy coated fiberglass composite is laminated with thin copper foil on both sides. On one side of the laminate, the copper is patterned using conventional printed circuit board manufacturing processes. The side containing the patterned copper layer is referred to as the inner layer. Two laminates having the inner layers facing each other are then bonded together typically using an FR-4 prepreg (a flame retarded partially cured sheet of epoxy coated fiberglass that has no copper foil cladding). The inner layers are then bonded together using the partially cured epoxy as an adhesive layer by pressing the construction together in a press at temperatures such as 360° F. (182° C.) for two hours at 200 psi, thereby fully curing the epoxy FR-4 adhesive layer. A composite is thereby created having non-pattered copper layers at the surfaces and patterned inner layers being separated by the adhesive layer. The top and bottom non-patterned copper layers (the outer layers) can then be print and etched yielding a four-layer circuit board.

One drawback of using many conventional thermosetting resins as the adhesive layer is the poor electrical properties of the bonding adhesive layer. Epoxy based thermosetting resin, for example, has poor electrical loss characteristics in the 1–100 gigahertz range. For very long trace lengths, signal degradation forces the use of lower loss dielectrics. This is increasingly becoming the case for high speed digital applications (routers, backplanes, motherboards and daughter boards). For the RF and mm wave frequencies, polytetrafluoroethylene (PTFE) based materials are traditionally used to prevent signal loss. PTFE based materials have been available for a long time for the most demanding low signal loss applications but have been avoided for cost considerations. Conventional thermosetting resins have too high a loss tangent at the high frequencies and are nearing their ultimate limits at 2.5 GHz. As frequencies extend to the 5 and 10 GHz range, it is likely that epoxy resins will be replaced by higher performing materials. Suppliers of epoxy laminate have been reducing the loss tangent of their products by switching to lower loss polyphenylene oxide based polymers and ceramic fillers. Typical PTFE products have 0.002–0.004 loss tangents versus 0.007–0.014 for epoxies and related materials (10 GHz). As signal integrity drives the use of higher performing materials, epoxy based solutions will eventually fall short even with high loadings of ceramics.

An alternative solution is the use of expanded PTFE that has been filled with epoxy and ceramic, thereby diluting the concentration of the higher loss epoxy component. This combination of epoxy, ceramic, and PTFE results in a sufficiently low loss product to be acceptable for high speed digital applications. The downside is that the expanded PTFE based solution is quite expensive and there are issues of dimensional movement that becomes significant with increasing layer count. U.S. Pat. Nos. 4,985,296; 4,996,097; 5,538,756; and 5,512,360 awarded to W. L. Gore describe the use of a thermosetting resin impregnated into an expanded PTFE web. These patents teach the use of incorporating ceramic in the PTFE expanded web manufacture and/or part of the non-fluorinated adhesive resin system to obtain low loss materials.

Ceramic filled resin systems based on polybutadiene-woven fiberglass based prepregs, both filled and unfilled with flame retardant additives, are known to be relatively low loss materials (U.S. Pat. No. 5,571,609). These materials suffer from the inconsistent quality of the peroxy cured rubber system and the poor bond strengths of the cured rubber to copper foil. A related material, crosslinked polyesters filled with kaolin, have attractive dielectric properties but unattractive peel strengths and other fabrication problems.

Polyphenyleneoxide (PPO, APPE, PPE) based resin systems that are cured systems of low molecular weight PPO and epoxy resins have some process limitations (U.S. Pat. Nos. 5,043,367; 5,001,010; 5,162,450) for high speed digital or high frequency applications. Their loss tangents in the gigahertz frequency range are reported to be in the 0.006–0.008 range. This is an incremental improvement over standard epoxy. Secondly, their lack of flow is a serious constraint.

Very low loss solutions include PTFE based materials and optical interconnects. Solutions containing pure PTFE based adhesive layers have the disadvantage that these materials need to be processed at temperatures exceeding 700° F. (fusion bonding, 371° C.). There are fabricators today building multilayer structures based on fluorinated resin systems. Most fabricators do not have equipment capable of pressing at these temperatures, nor are the extended heating and cooling cycles attractive to fabricators. High temperature pressing on a 34 layer count stackup could result in decreased reliability of plated through holes, PCB warping, and copper pad distortion. In high speed digital applications, via holes are a real source of signal loss. The alternative is very high layer count boards. The number one obstacle for high speed digital applications is the high layer count stack-up that encourages OEMs to source board materials that are process friendly. For high speed digital applications, the high frequency materials will be separated from the standard FR4 lower frequency layers. This leads to multiple lamination cycles. Fabricators prefer to press laminates relatively quickly at conventional epoxy pressing temperatures below 350° F. (177° C.) and have scaled their pressing capacity so that it is not a bottleneck in the entire printed circuit board fabrication process. Thus FR-4 is a material of choice. However, increasing operating frequencies demand materials having lower loss characteristics. Therefore, a composite that enables multilayer lamination at epoxy processing temperatures that has a minimum component of a hydrocarbon resin is especially desirable.

Disclosed in this invention is a fluoropolymer coated fiberglass composite that is used as the component to deliver low signal loss properties. The fluoropolymer coated fiberglass composite is then surface treated to enable it to bond to other surfaces. Surface treatment is conducted on the nanometer scale in order to maintain the desirable bulk properties of the fluoropolymer. A thin layer of a thermosetting resin which may or may not contain a ceramic filler (refer to FIG. 1) is then applied to the surfaces of the chemically modified sheet of fluoropolymer coated glass. Although the thermosetting resin represents a compromise to the otherwise good electric properties of the PTFE coated fiberglass, the thermoset enables the manufacture of a multilayer laminate at conventional epoxy processing temperatures. The thermosetting resin is partially cured (B-staged) during the application of the thermoset onto a fluoropolymer composite comprising a substrate selected from woven fabric, non-woven or a polymeric film. The electrical properties of the resulting prepreg is then determined by the ratio of the coated thermosetting resin to the fluoropolymer coated fiberglass starting material. It is preferred to limit the amount of thermosetting resin to just enough to fill the spaces between the copper traces of the inner layers and still obtain a good bond.

SUMMARY OF THE INVENTION

In one aspect, the present invention relates to a process for fabricating a low loss multilayer printed circuit board using a bonding ply comprising a fluoropolymer substrate and a thermosetting adhesive composition. The fluoropolymer composite comprises at least one fluoropolymer and a substrate selected from woven fabrics, nonwoven fabrics and polymeric films.

In another aspect, the invention relates to a multilayer printed circuit board comprising a plurality of printed circuit board layers bonded together by means of the same bonding ply.

In yet another aspect, the invention relates to a composition comprising a fluoropolymer composite comprising at least one fluoropolymer and a substrate selected from woven fabrics, nonwoven fabrics and polymeric films; and a thermosetting adhesive composition.

DETAILED DESCRIPTION OF THE INVENTION

The present invention relates to a process for fabricating a low loss multilayer printed circuit board. The process comprises laminating together a plurality of printed circuit board layers by means of at least one thermosetting adhesive-coated fluoropolymer composite bonding ply. The bonding ply comprises a fluoropolymer composite and a thermosetting adhesive composition; the fluoropolymer composite comprises at least one fluoropolymer and a substrate selected from woven fabrics, nonwoven fabrics and films.

PTFE copper clad laminate suppliers currently sell composites consisting of PTFE and either fiberglass or chopped fiber. Woven fiberglass is preferably coated with PTFE at 700° F. (371° C.) to a desired thickness. Generally, multiple coating passes are necessary to sequentially build layers of PTFE such that a composite is obtained having the desired thickness. The coated fiberglass is then sandwiched between copper to form a composite consisting of a component that is electrically conductive (the copper) and a component that is not (PTFE/fiberglass).

Figure 1:
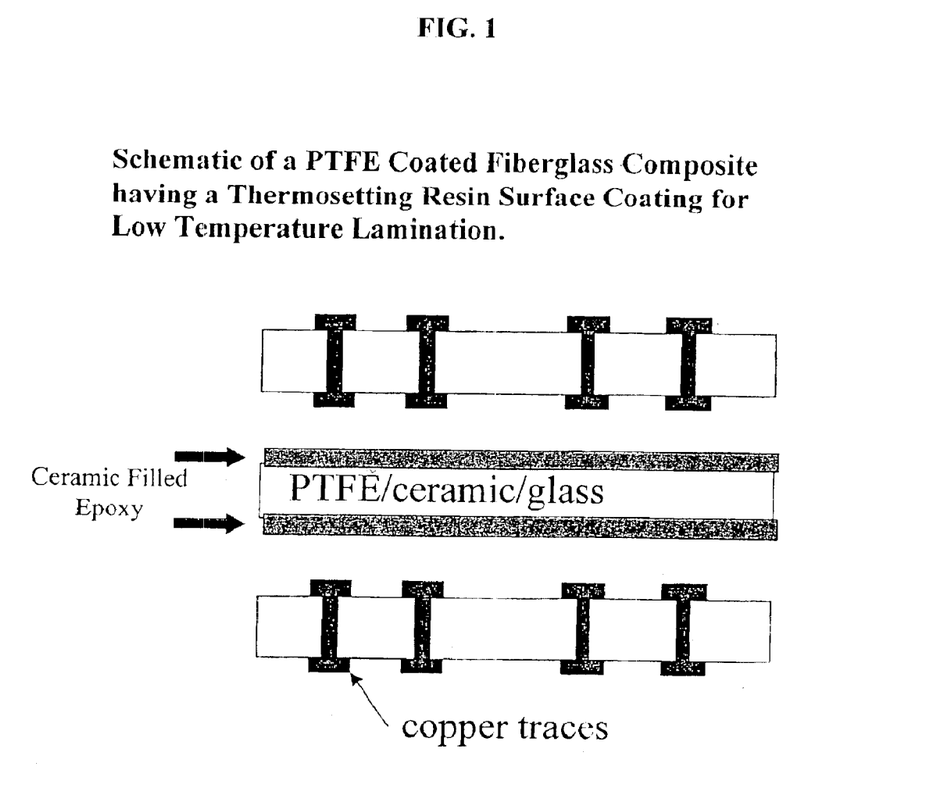
FIG. 1 shows a schematic of the bond ply comprising fiberglass, PTFE, and a thermosetting resin adhesive layer.

Disclosed herein is a process that enables circuit board fabricators to connect multiple layers of fluoropolymer-based substrates together at reasonable fabrication temperatures ($\cong$350° F./177° C.). The invention disclosed herein is a hybrid composite that has the advantages of PTFE but can be processed like a low temperature thermoset. FIG. 1 shows a low signal loss microwave circuit bonding ply that can be used to connect two double sided circuit boards (PTFE/fiberglass double sided circuits). The thermosetting resin (adhesive) can be thought of as the adhesive that holds the printed circuit boards together. During epoxy lamination, for example, the printed circuit boards can be withdrawn from a press rapidly after holding at their curing temperature and placed in a cooling press.

The reinforced first phase (fluoropolymer composite) can be prepared by impregnating, for example, woven fiberglass in a roll to roll fashion using a dip-coating process or a dual reverse roll coating process. Sequential buildup facilitates the manufacturing of the overall composite. Woven glass fabric is conveniently impregnated with PTFE dispersion or a common fluoropolymer aqueous dispersion in a multi-pass process to a desired thickness or build weight. Coating is continued until a homogenous sheet is formed where the glass fabric may or may not be completely coated. Coating could be a single pass or a multiple pass process.

It is a preferred embodiment of this invention that the particulate filled resin be cast onto a substrate. The substrate may or may not be a reinforcement. Suitable substrates include: woven or non-woven fabrics; crossplies of unidirectional tape; a polymeric film; or a metallic film. Metallic films include copper, aluminum, and the various grades of steel. Polymeric films include Kapton® (available from Dupont), and Upilex® (available from UBE industries), a polyimide based on biphenyltetracarboxylic dianhydride and either of p-phenylenediamine or 4,4'diaminodiphenylether. Woven fabrics can be prepared from glass filaments or filaments based on various polymers. Suitable organic polymeric fibers consist of the following: PTFE or other fluoropolymer fibers; polyaramides such as Teijin's Technora based on p-phenylenediamine and 3,4'-diaminodiphenylether, meta aramids such as Nomex® based on poly(m-phenyleneisophthalamide); liquid crystalline polyesters such as those based on hydroxynapthoic acid and hydroxybenzoic acid; polyetheretherketones (PEEK®, available from Victrex USA); polybenzoxazole (PBO, available from Toyobo); and polyimides. These polymeric fibers can be used to make woven fabrics or they can be chopped or pulped and used to make non-woven fabrics. In the preparation of non-woven fabrics, blends of different fibers might be used, or blends containing chopped glass fiber can be used. Non-woven fabric has the advantage that very thin laminates can be prepared. Because the fibers are random, improved drilled holes can be obtained, regardless of the drilling technique, laser or mechanical. Low in-plane CTE results in exceptional layer to layer registration. The non-woven fabric can be coated roll to roll in a typical dipcoating process or alternatively staple-pulped fiber can be added to an aqueous PTFE dispersion and coated onto a release substrate. In another embodiment, a fluoropolymer coating can be applied to the fabric by hot roll laminating a fluoropolymer film or a fluoropolymer skived material into the fabric thus eliminating the need for multiple coating passes. The film may or may not contain a ceramic filler.

Woven glass reinforced composites could be prepared from the following glass styles (E, D, S, NE), or mixtures thereof. Newly developed NE glass styles available from Nittobo (Japan) have lower loss characteristics but have a cost disadvantage. Glass fabric based on 4–6 micron filaments are preferred from a drilling perspective. Typical glass styles that are preferred include: 106, 1080, 2112, 2113, 2116, and 7628. For laser drilling applications the smaller diameter based glass fabrics are preferred.

Woven glass fabrics are particularly suitable as substrates for the fluoropolymer composite. Examples of such woven glass include 7628, 1080, or 106 style glasses with a 508 heat cleaned finish produced by Hexcel Schwebel.

Various fluoropolymers can be used to prepare the reinforced first phase. Polytetrafluoroethylene (PTFE) or modified polytetrafluoroethylene are well known to those skilled in the art. Modified PTFE contains from 0.01% to 15% of a comonomer which enable the particles to fuse better into a continuous film. PTFE is typically modified with a small quantity of a fluorinated alkyl vinyl ether, vinylidene fluoride, hexafluoropropylene, chlorotrifluoroethylene, and the like. High level of modification leads to polymers such as PFA poly(perfluorinatedalkylvinylether-tetrafluoroethylene) or FEP poly(perfluorinated-tetrafluoroethylene-hexafluoropropylene). Other fluoropolymers which may serve as a dielectric include: polychlorotrifluoroethylene; copolymers of chlorotrifluoroethylene with vinylidene fluoride, ethylene, tetrafluoroethylene, and the like; polyvinylfluoride; polyvinylidenefluoride; and copolymers or terpolymers of vinylidene fluoride with TFE, HFP, and the like; and copolymers containing fluorinated alkylvinylethers. Other fluorinated, non-fluorinated, or partially fluorinated monomers that might be used to manufacture a copolymer or terpolymer with the previously described monomers might include: perfluorinated dioxozoles or alkyl substituted dioxozoles; perfluorinated or partially fluorinated butadienes; vinylesters; alkylvinyl ethers; and the like. Hydrogenated fluorocarbons from C2–C8 are also envisioned. These would include trifluroethylene, hexafluoroisobutene, and the like. Fluoroelastomers including the following are also envisioned: HFP with VDF; HFP, VDF, TFE copolymers; TFE-perfluorinated alkylvinylether copolymers; TFE copolymers with hydrocarbon comonomers such as propylene; and TFE, propylene, and vinylidene fluoride terpolymers. Fluoroelastomers can be cured using the following crosslinking agents: diamines (hexamethylenediamine); a bisphenol cure system (hexafluroorisopropylidenediphenol); peroxide (2,5-dimethyl-2,5-di-t-butylperoxyhexane); any base that can act as a dinucleophile.

Fluoropolymer dispersions that (1) readily rewet (2) are available at low cost and (3) have low dielectric loss characteristics are preferred. Aqueous dispersions of fluoropolymers can contain a particle size from 1 nanometer to 1000 nanometers. The particle size of the fluoropolymer dispersion is not important as long as the substrate can be well impregnated. Microemulsions or blends of conventional fluoropolymer dispersions with aqueous microemulsions are also suitable. The fluoropolymer component could also be coated from a solvent vehicle onto the reinforcement.

Although it is embodied that the reinforced core first component comprise a fluoropolymer, the first component could be comprised of a hydrocarbon polymer that could benefit from an adhesive layer that could improve the performance of the hydrocarbon resin alone. Cured elastomers such as polybutadiene, for example, are known to have poor adhesive properties and would benefit from a second layer of an adhesive phase. The rubber may be any natural or synthetic rubber or a combination thereof. Generally, the rubber may be any saturated or unsaturated polyalkylene rubber made up of ethylene, one or more alkenes with 3–8 carbon atoms, for instance, propylene and/or 1-butene, and, if desired, one or more polyethylenically unsaturated compounds with non-conjugated double bonds, for instance, 1,4-hexadiene, dicyclopentadiene, 5-methylene-2-norbornene, 5-ethylidene-2-norbornene and 5-isopropylidene-2-norbornene. The rubber can therefore be any suitable natural rubber, synthetic polyisoprene, any of the neoprenes,(polychloroprene), styrene-butadiene rubbers (SBR), acrylonitrile-butadiene rubbers (NBR), acrylonitrile-butadiene-styrene polymers (ABS) high molecular weight olefin polymers with or without other monomers or polymers such as butyl rubber and cis- and trans-polybutadienes, bromobutyl rubber, chlorobutyl rubber, ethylene propylene rubbers, nitrile elastomers, polyacrylic rubber, polysulfide polymers, silicone elastomers, poly- and copolyesters, ethylene acrylic elastomers, vinylacetate ethylene copolymers, or chlorinated or chlorosulfonated polyethylenes, or a mixtures thereof. The rubber may also contain a ceramic filler.

It is envisioned that such a first phase could comprise a ceramic, fused silica for example, a reinforcement, woven fiberglass for example, and a cured elastomer resin system, containing high and low molecule weight polymers comprised of butadiene, isoprene, neoprene, or styrene. The second adhesive component then might comprise a polymeric resin system known to have better adhesive properties or better flow properties. This second adhesive component might include an epoxy, a cyanate ester, or any number of the various thermosetting resin systems known to those skilled in the art.

The surface of the fluoropolymer composite or the first phase composite can then be treated before applying the thermosetting adhesive composition to facilitate bonding therebetween. Etching techniques for modifying the surface of a fluoropolymer are known in the art. These include etching by: sodium ammonia etch, radiation, electron beam, sodium naphthalene etch, plasma using hydrogen, argon, nitrogen, carbon tetrafluoride gases, and the like. Once the surface of the first phase is treated, a thermosetting resin can be applied by conventional coating methods. Depending on the amount of filler incorporated into the reinforced first phase, surface treatment may not be necessary to obtain good adhesion to the adhesive layer. It is known to those skilled in the art that laminates having high ceramic loadings that have drilled holes may not need surface treatment before plating. The second phase is typically coated simultaneously onto both sides of the fluoropolymer composite using two reverse roll treaters, one per side. The second phase is typically prepared by driving off the solvents used to dissolve the thermosetting resin. The thermosetting resin is applied as a flat continuous film on the surface of the fluoropolymer impregnated reinforced sheet. Although it is preferred that the second component be a thermosetting resin processible at low temperatures, deposition of a thermoplastic layer onto the first component is also envisioned.

The thermosetting component is preferably a non-fluoropolymer but a thermosetting fluoropolymer is also envisioned. The thermosetting adhesive component should have a glass transition of at least 100° C. or a glass transition that is very difficult to detect by common techniques such as DMA or TMA, or a CTE that results in a total (x, y, and z) coefficient of thermal expansion in the unreinforced state of around 50–100 ppm over the temperature range 50–300° C., although less than 50 ppm would be preferred.

Typical thermosetting resin systems that could be used include: epoxies (phenol epoxy novolacs; cyclopentadiene based epoxies; brominated epoxies; diamine cured epoxy resin systems (diaminodiphenylsulfone); trisepoxies; multifunctional epoxies; styrene-maleic anhydride copolymers cured with epoxies or polyamines; norbornene-maleic anhydride copolymers cured with epoxies or polyamines; bicyclic alkane compounds of the general structure bicyclo [x.y.z.]alkane-anhydride copolymers cured with epoxies; cyanate ester resins such as those based on bisphenol A or novolac resins; cyanate ester resins cured with epoxies; polynorbornene cured with a free radical generator; polynorbornene blends containing, for example, any combination of polybutadiene or polyisoprene; free radically cured polybutadiene of varying molecular weights with optionally polyisoprene; acetylene functionalized polyimide; functionalized polyphenylene oxide and blends of functionalized PPO with epoxies; bis-triazine resin systems with the optional addition of epoxies; multifunctional aziridines; poly (bismaleimides), specifically bismaleimides based on diaminodiphenylmethane; and bismaleimides cured with diallyl-bisphenol A or other bisallylphenyl compounds; norbornene terminated polyimides, poly(bis phenylcyclobutane); free radically cured unsaturated polyesters; and the like. Other non fluorinated adhesive layers could also include: polymethylvinylether; polyvinylpyrrolidone; polybutadiene; copolymers of polybutadiene and styrene; elastomers containing any combinations of butadiene, isoprene, styrene, or neoprene, elastomers of ethylene and propylene; elastomers of acrylonitrile and butadiene; and the like. The thermosetting resin system does not include lightly crosslinked pressure sensitive adhesives which have a low glass transition temperature. The thermosetting resin can be applied immediately following the preparation of the first substrate in a pseudo one-step process or it can be applied at any time thereafter.

The adhesive layer could also include a fluorelastomer. Fluoroelastomers include the following: copolymers of vinylidene fluoride and hexafluoropropylene; copolymers of hexafluoropropylene, vinylidene fluoride, and tetrafluoroethylene; copolymers of vinylidene fluoride and perfluoroalkyl vinylethers with or without tetrafluoroethylene; copolymers of tetrafluoroethylene with propylene; copolymers of tetrafluoroethylene with perfluoroalkylvinylethers; a terpolymer of propylene, vinylidene fluoride, and tetrafluoroethylene. Fluoroelastomers can be cured using the following crosslinking agents: diamines (hexamethylenediamine); a bisphenol cure system (hexafluorooisopropylidenediphenol); peroxide (2,5-dimethyl-2,5-ditbutylperoxyhexane); any base that can act as a dinucleophile. In some cases it might be preferred to incorporate a cure site monomer into the polymer backbone to promote curing. These might include halogen containing olefins such as 1-bromo-2,2-difluoroethylene or 4-bromo-3,3,4,4-tetrafluoro-butene. Other cure site monomers might include nitrile containing vinylethers and hydrogen containing olefins The thermosetting resin may optionally contain a flame retardant. Brominated aromatics can be readily used including: brominated epxoy resins; glycidyl ethers of brominated bisphenol A; ethylene bistertrabromophthalal imide; tetradecabromo diphenoxy benzene; pentabromodiphenylether; brominated trimethylphenyl indane; pentrabromobenzylacrylate; poly pentabromobenzylacrylate; 2,4,6-tris (tribromophenoxy)-1,3,5-triazine; oligomeric brominated polycarbonate; antimony oxide; phosphate esters; brominated phosphate ester compounds; and the like.

Either the thermosetting resin adhesive component or the reinforced first phase or both may optionally contain any one or combination of a number of fillers. Particulate fillers are typically polymeric, inorganic, ceramic, or organometallic. Fillers are used to modify the electrical, thermal, improve the dimensional stability of the laminate, and reduce cost. It is well known that the addition of various fillers will reduce the coefficient of thermal expansion of the composite, a reduction in the z axis being highly desirable for the reliability of plated through holes. X-Y CTE reduction enables smaller copper pads to be used and less layer to layer miss-registration.

In many cases, particulate fillers are added to tailor the dielectric constant of the composite. Ceramic fillers typically include any one of the following: quartz; alumina; titanium dioxide; strontium titanate; barium titanate; alumina; colloidal, or crystalline silica; chopped glass fiber; magnesia; aluminum silicate (kaolin); steatite; zircon; quartz; boron nitride; silicon nitride; aluminum nitride; silicon carbide; talc; beryllia; barium titanate; mica; hollow or solid glass spheres. However, at times it is advantageous to add polymeric fillers available as powders including PTFE, polyetherketones, polyetheretherketones, polyphenylenesulfide, polyethersufone, polyimide, polyester, liquid crystalline polyester, polyamide, polyesteramide, polybutadiene rubber, and other elastomeric materials which might include butadiene, isoprene, neoprene, or dicyclopentadiene. Low loss fillers that can be readily dispersed in a solvent born matrix are preferred. For aqueous dispersions, small particle powders are preferred.

The introduction of particulate fillers, particularly inorganic fillers, into a printed circuit board laminate is not without its drawbacks. The fillers introduce another interface into the composite that can be a source of moisture absorption leading to blistering and delamination upon exposure of the board to wet chemistry steps (print and etch), followed by exposure to higher temperatures during sweat soldering or hot air solder leveling. The proximity of the filler to the glass or polymeric reinforcement may lead to a weak boundary region between interfaces leading to a laminate that is susceptible to delamination, blistering, or the plating of unwanted metals. In addition, the ceramics generally do more damage to a mechanical drill bit during the preparation of plated through holes. This exposure of new ceramic surface area during mechanical drilling might also be a source of failure. It has been previously disclosed in the art to pre-coat the surface of the particulate with a hydrophobic coating to improve the moisture resistance of the resulting composite which is also claimed to improve the adhesion of the particle to the matrix materials. (U.S. Pat. Nos. 5,024,871, 4,849,284, and 5,149,590). The disclosed examples specifically teach the use of hydrophobic coatings consisting of either silanes, zirconates, or titanates, all well known inorganic coupling compounds. According to prior art, in a separate step, the particulate is precoated and then the precoated particle can be further formulated, extruded, or further processed in a separate step. Depending on whether the filler is added to a water born system or a solvent born thermosetting system, there use of a hydrophic surface coating may or may not be required. Other technologies are available that eliminate the need for a hydrophobic coating such as an organosilane.

The dielectric properties will consequently be a combination of the thermosetting component and the thermoplastic component. Therefore it is preferred to limit the thermosetting component to just a sufficient quantity to accomplish bonding of the various layers or encapsulation of copper or another substrate. Because an epoxy, for example, has a substantially worse dielectric loss, it is preferred to limit its use. The preferred embodiment includes applying a 0.1 to a 0.7 mil dry layer of the thermosetting resin onto the surface of the fluoropolymer coated glass composite. Because the thermosetting layer is preferably thin, inorganic or organic fillers should have a sufficiently low particle size to yield a homogeneous film. The filler should be less than 50 microns in size, preferably less than 25 microns, and most preferred, less than 10 microns. The filler should be less than 80% by weight of the combined filler and thermosetting resin total dry weight, preferably from 10–60%, and most preferred from 30–50%. Too high a filler content is difficult to coat and leads to poor adhesion between the layers. Too low a filler content leads to less dimensional stability, higher cost, and in some cases higher loss. The same considerations are true for ceramics incorporated into the fluoropolymer reinforced composite substrate. The preferred ceramic loading is 10–70 wt %.

The thermosetting resin composition and the fluoropolymer dispersion can be coated using a number of different methods. The resin compositions can be applied to the carrier or substrate using spray coating, dipcoating, reverse roll coating, gravure coating, metering rod coating, pad coating, or any combination of the above. In the case of the fluoropolymer component, the preferred method is to dipcoat the reinforcement into a resin composition and using a metering rod control the amount of pickup of the resin composition onto the carrier or reinforcement. In the case of the thermosetting resin system, it can be metered on by a Mayer rod after dipcoating the flurpolymer sheet into a resin bath or it can be transferred coated using a dual reverse roll controlled gap setup.

The weight ratio of the surface coated thermosetting hydrocarbon resin to the reinforced core is preferably 1:1 to 1 to 50. The core is defined as the first phase composite comprised of the substrate and the polymeric resin system and optionally a filler. It is more preferred that the surface coated thermosetting resin have a weight ratio of 1:2 to 1:20 to the reinforced core. It is most preferred that the surface coated thermosetting resin have a weight ratio of 1:3 to 1:10. The most preferred ratio of thermosetting resin surface coating to the reinforced core will vary depending on the low loss characteristics of the epoxy, the thickness of the copper, the degree to which the copper is etched yielding a requirement for a volume of space that must be filled by the flowing thermosetting component, and the amount and type of ceramic that may or may not be added to the thermosetting resin composition. The previously described weight ratios take into consideration any ceramic filled that would be added to the thermosetting resin composition. Although ceramic might also be added to the core material, the weight ratios assume the total weight of the core, regardless of the core is comprised of a resin, a reinforcement, or a filler.

Figure 5:
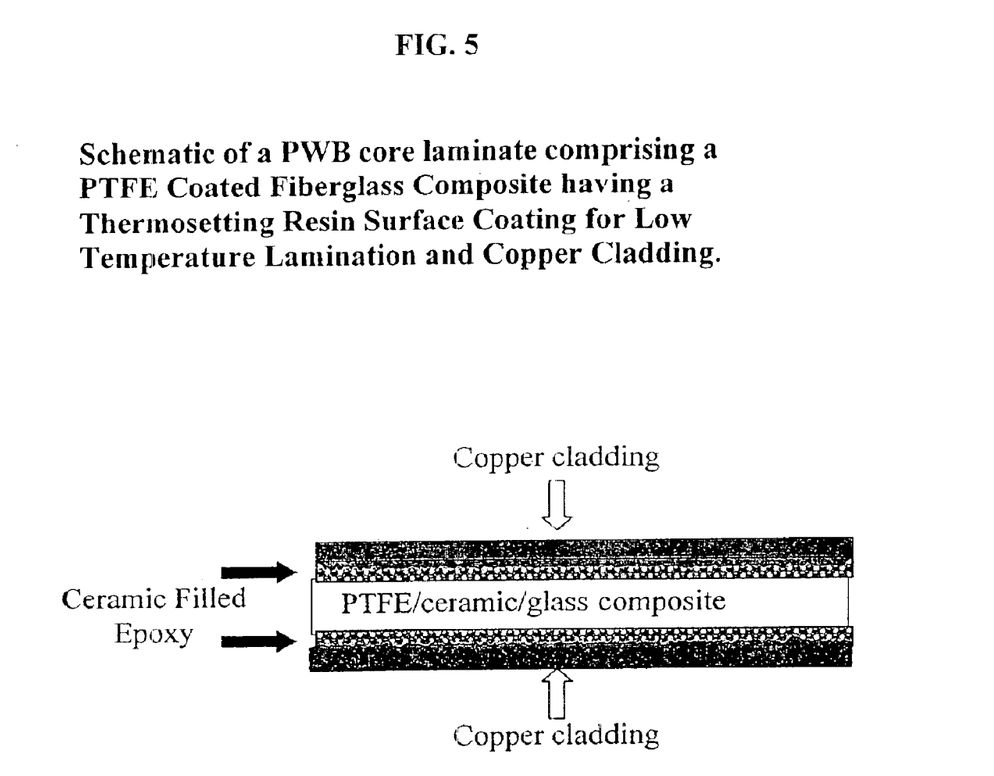
FIG. 5 shows a schematic of a laminate core material comprising fiberglass, PTFE, a thermosetting resin adhesive layer, and copper cladding.

In an alternative embodiment of the invention, the bondply can be laid up with copper and pressed in a conventional FR-4 copper clad lamination press. A single bond ply can be sandwiched between coppers to make a single laminate core, as shown in FIG. 5. The choice of copper styles could include rolled or electrodeposited. The copper could be zinc free or zinc containing, low profile, very low profile, or ultralow profile. Copper could also be sputtered onto the faces of the adhesive layer to obtain very thin layers of copper. Other copper styles could be high temperature elongation or reverse treated. Alternatively, an omega foil nickel resist could be applied.

In the preparation of a copper clad laminated using this invention it is envisioned that appreciably less thermosetting adhesive is necessary. As a bond ply, the thermoset needs to flow and encapsulate 0.5, 1.0, and 2.0 ounce circuitry of varying density. As a laminate core material, the thermoset need only fill the dendritic surface area of electrodeposited copper, for example. Depending on the topography of the metallization layer, very low profile copper or rolled copper would need little thermosetting adhesive to promote bonding between the layers.

This invention also enables the incorporation of UV dyes into a fluoropolymer based printed circuit board. UV dyes are typically incorporated into FR4 epoxy formulations to enable automated optical inspection (AOI). Many of these dyes would not be stable at the processing temperatures of many fluoropolymers. However, the UV dye can be added as an additive to the lower temperature thermosetting adhesive composition.

Essentially any printed circuit boards may be laminated together using a bonding ply according to the present invention. In particular, printed circuit boards composed of epoxy fiberglass composites, such as FR-4; or laminates comprised of any of the following: PTFE; cyanate ester; polyimide; styrene; maleic anhydride; butadiene; bismaleimide; isoprene; neoprene; polyester, and others known to those skilled in the art would be suitable.

EXAMPLES

Example 1

Preparation of a Fluoropolymer Coated Woven Glass Fabric 7628 style woven fiberglass with a 508 heat cleaned finish (available from Hexcel Schwebel) was further heat cleaned in a 3 zone vertical coating tower at 7.5 feet/min. The temperatures in the 3 zones were as follows: 121° C., 204° C., and 418° C. A 5% solution of 3-aminopropyltriethoxysilane in water was then applied to the fabric using a smooth metering rod. The fabric was fed into a dip basin and the pickup was controlled by the smooth metering rod on each side of the fabric. Oven temperatures were: 121° C., 177° C., and 260° C. Coating speed was 5 feet/min. The fabric was then dipcoated with a 1.45 specific gravity aqueous dispersion of PTFE to which was added 5% based on PTFE solids of 3-aminopropyltriethoxysilane. The PTFE aqueous dispersion was coated using two sets of smooth bars to apply the dispersion. Oven temperatures were as follows: 121° C., 204° C., and 391° C. Coating speed was 3 feet/min. The fabric was then coated repeatedly using a multiple pass process with a ceramic filled aqueous PTFE dispersion. The ceramic dispersion contained titanium dioxide, PTFE, 3-aminopropyltriethoxysilane, a ceramic dispersing agent, a non-ionic surfactant, a strong organic acid, and a perfluorinated poly(tetrafluoroethylene-alkylvinylether) copolymer. Coating speed varied from 4–8 feet/min. Oven temperatures were 93° C., 204° C., and 399–407° C. Coating speeds were from 3–8 feet/min. The 7628-508 style fiberglass was coated to a final weight of 0.95 lbs/yd$^2$ to yield a smooth sheet. The sheet was obtained on a roll and was treated with a sodium ammonia etching compound to activate the surfaces.

Example 2
Preparation of an Epoxy Coated, Fluoropolymer Impregnated Woven Glass Fabric An epoxy formulation was prepared by blending a catalyst composition with an epoxy resin formulation. The catalyst composition was prepared by mixing 1.98 kg of methylether ketone solvent, 0.184 kg of a non-ionic surfactant (Pluronic L92 available from the BASF Corporation), and 0.0369 kg of manganese 2-ethylhexanoate (available from OMG Americas). The epoxy formulation was prepared by blending the following: 40.147 kg of Dow 538-A80 (a glycidyl ether of brominated bisphenol A available from the Dow Chemical Company), 38.87 kg of BT2110 (a bismaleimide/bisphenol A dicyanate oligomer available from the Mitsubishi Gas Chemical), 13.9337 kg of DER560 (a brominated epoxy resin available from the Dow Chemical Company), 5.379 kg of Shell Epon 55-BH-30 (a bisphenol A based epoxy available from the Shell Oil Company), 12.16 kg of dimethylformamide solvent, 9.0 kg of methyletherketone, 9.0 kg of propyleneglycol methyl ether acetate, and 5.7 kg of Phenoxy PKHS-40 (a poly (hydroxyether) available from Inchem Corp). Prior to use, 136 kg of the epoxy formulation was mixed with 2.20 kg of the catalyst solution.

The thermosetting resin solution was coated onto both sides of the fluoropolymer coated 7628 fabric using a Litztler dual reverse roll coater. The thermoset was applied using a 13 mil gap between the two reverse rolls. The Litzler had two oven sections. Zone 1 was 90° C. while Zone 2 was 165° C. The Litzler is a vertical treater with one 7.5 meter length zone extending vertically connected to another 7.5 meter zone that returns to the base of the treater. The thermoset was coated at 2.5 meters/minutes resulting in a 3 minute dwell time in each of the high and low temperature ovens. The dried prepreg had a final 10 mil thickness, 9 mil from the base fluoropolymer coated fabric, and 0.5 mil per side of the thermosetting resin.

3 plies of the prepreg were stacked up and pressed at 176.6° C. for 10 minutes at 300 psi. The prepreg was weighed before and after pressing. The resin that squeezed out of the press was collected and weighed. 3.5% resin flowout was obtained.

Two plies of the material were sandwiched between 2 pieces of 1 oz. zinc free foil and pressed between skived PTFE sheets that was used for release purposes. The press conditions were 176.6C for 2 hours at 300 psi. The copper cladding was etched off and the samples were dried. The following electrical properties were obtained; dielectric constant was 3.50 (IPC-TM 650 2.5.5, 1 MHz), dielectric loss of 0.0047 (IPC-TM 650 2.5.5, 1 MHz), dielectric constant at 10 GHz of 3.41 (IPC TM 650 2.5.5.5), dielectric loss at 10 GHz of 0.0055 (IPC TM 650 2.5.5.5). Peel strength was 13.6 lbs/linear inch (IPC-TM 650 2.4.8). Moisture absorption was 0.28% after 24 hour immersion. Moisture absorption after 1 hour of pressure cooker exposure was 0.84%. This example demonstrates that very attractive electrical properties can be obtained even in the absence of a ceramic filler that might be added to the thermosetting resin to offset the less desirable loss tangent properties of the thermosetting resin itself.

Example 3
Preparation of a Hybrid 4 Layer Mutlilayer Circuit Board Using the Bond Ply from Example 2.

The inner layers of (1) a 21 mil PTFE coated fiberglass laminate cladded on both sides with 0.5 oz copper and (2) a 48 mil FR-4 epoxy laminate cladded on both sides with 0.5 oz copper were patterned and etched according to the following (subtractive process) standard printed circuit board procedures: punch, holes drilled, hole deburr, scrub & coat inner layers with photoimaging material, expose inner layers, develop inner layers, and strip inner layers. The inner layers of the FR-4 and PTFE fiberglass were then treated with metal oxide, baked, and laminated together using the multilayer bond ply prepeg from Example 2. Press conditions were 176° C. for 2 hours at 300 psi. The 4 layer multilayer was then treated with the following standard outerlayer print and etch processes: drilled, deburred, baked, treated for etchback, sodium napthalene etch, electroless plated, photomaterial lamination, expose outer layers, develop outer layers, pattern plate copper and then tin, resist strip, and etch outer layers. A second imaging step was done as follows: bake dry film and apply, coat outer layers, expose outer layers, develop outer layers, tin/lead strip, strip resist, bake before reflow, solder reflow, coat liquid photoimageable soldermask, expose solder mask, develop soldermask, and UV cure solder mask.

Figure 2:
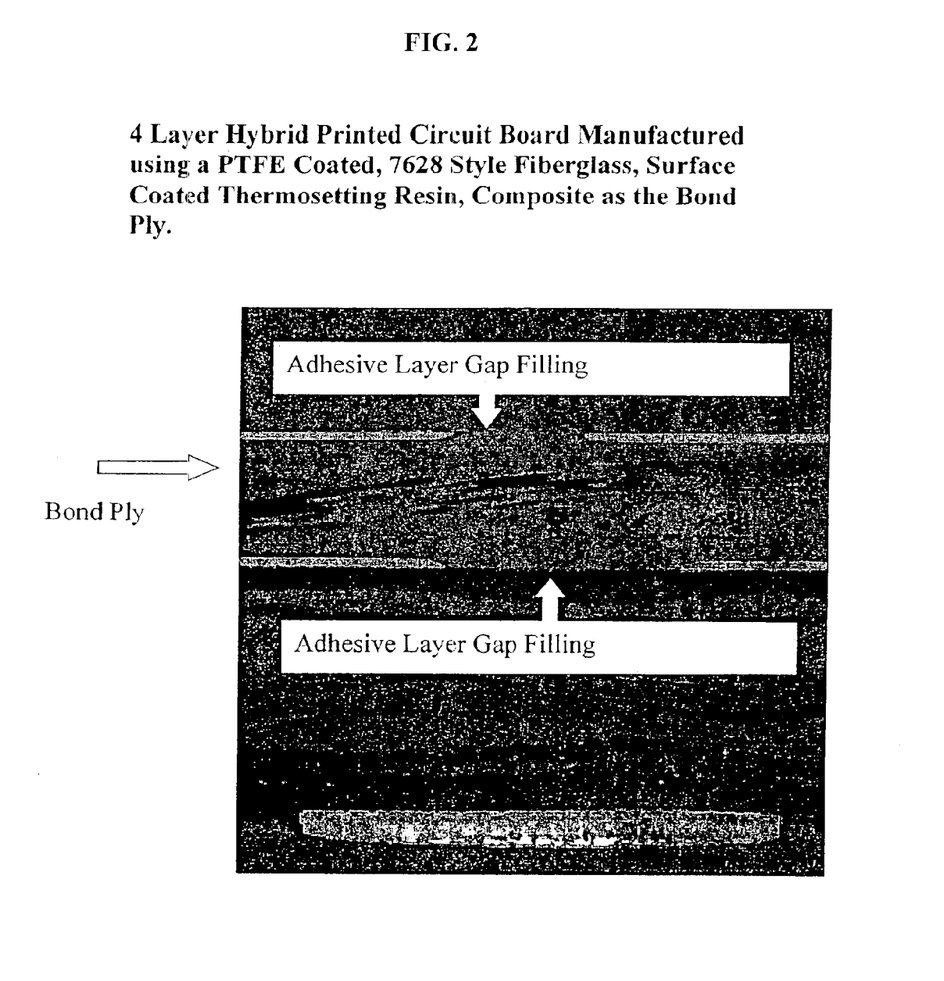
FIG. 2 is a microsection showing the gap filling ability of a bond ply (prepreg or bonding ply) comprised of 7628 style fiberglass, ceramic, PTFE, and an thermosetting adhesive layer, to fill signal traces in a hybrid multilayer.
Figure 3:
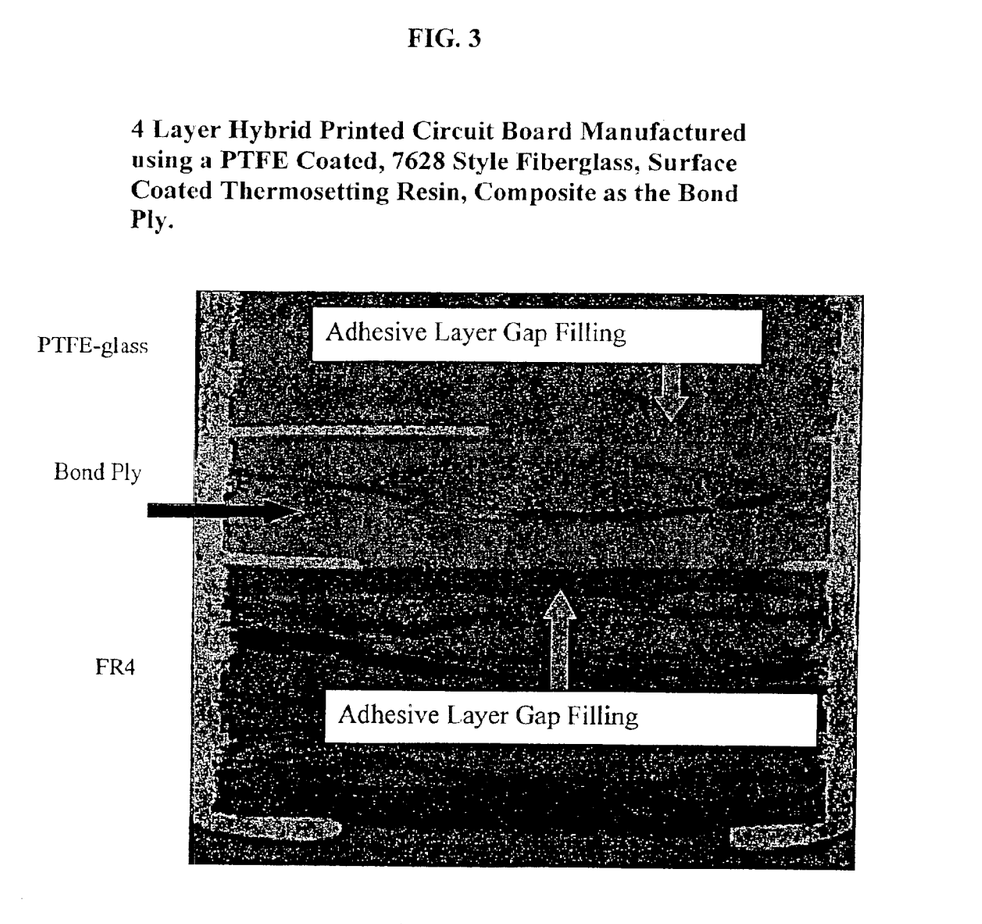
FIG. 3 is a microsection showing the gap filling ability of a bond ply comprised of 7628 style fiberglass, ceramic, PTFE, and an thermosetting adhesive layer, to fill signal traces in a hybrid multilayer.

Examples of the gap filling ability of the multilayer prepreg bond ply from Example 2 can be found in FIGS. 2 and 3. FIGS. 2 and 3 confirm the desired gap filling properties of the bond ply. Microsectioning of the hybrid board did not reveal the prescence of any voids between the copper circuitry. This example demonstrates that multilayer hybrid boards can be prepared at conventional thermosetting resin conditions using a fluoropolymer-fiberglass-epoxy resin composite B-staged bond ply as the adhesive layer.

Figure 4:
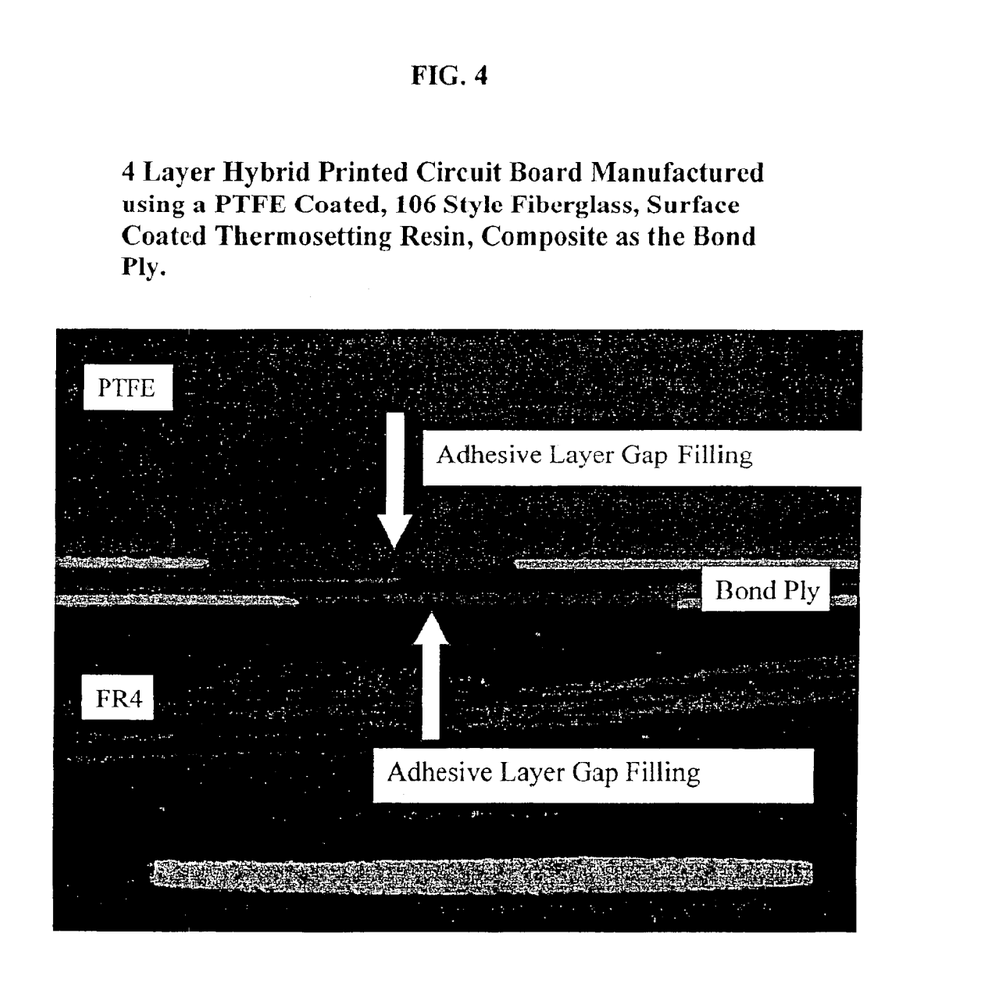
FIG. 4 is a microsection showing the gap filling ability of a bond ply comprised of 106 style fiberglass, ceramic, PTFE, and an thermosetting adhesive layer, to fill signal traces in a hybrid multilayer.

Example 4
Preparation of a Hybrid 4 Layer Mutlilayer Circuit Board Using a 106 Style Fiberglass Composite Bond Ply Examples 1 and 2 were repeated with the exception that the base PTFE composite was a PTFE coated 106 style woven fiberglass that was coated in a multi pass process to a 60% PTFE content based on the total composite (1.45 mil thickness). The material was then etched using a sodium ammonia etching process. Thermosetting resin was applied to both sides using the previously described procedures. The gap between the reverse rolls was 10 mil that yielded a product having a thickness of approximately 2.5 mils. A 4 layer multilayer was made using the procedure described in Example 3. The gap filling properties of the bond ply are shown in FIG. 4. FIG. 4 confirms the desired gap filling of the bond ply. This example also demonstrates that the invention disclosed herein is applicable to very thin substrates.

Example 5
Preparation of a Fluoropolymer Impregnated Woven Fiberglass Composite Using a Talc filled Epoxy as the Bonding Layer Example 2 was repeated except that 86.5 kg of talc (Benwood talc available from Zemex Fabi Benwood, LLC) is dispersed into the thermosetting resin formulation to reduce the impact of the thermosetting resin on the dielectric loss properties of the final laminate. The talc filled thermosetting resin solution is coated onto the 7628 style fiberglass using the previously described coating method. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties.

Example 6
Preparation of a Fluoropolymer Coated Non-Woven Glass Fabric 1.5 mil non-woven polyaramide fabric (Thermount, available from Dupont) made from pulped and/or staple Kevlar or Nomex fibers is coated under low tension according to Example 1 to a 70% PTFE resin content using a PTFE aqueous dispersion. The surface of the composite is sodium naphthalene etched and coated with thermosetting resin according to the process described in Example 2. A 4 layer multilayer is built using the procedure outlined in Example 3. This examples demonstrates that a bond ply can be prepared from a non-woven substrate that is suitable for high density interconnect packages such as: multichip modules, ball grid array packages, direct chip attach, and ultra fine lines and spaces. This example further demonstrates that a substrate can be produced that is well suited for laser drilling.

Example 7
Preparation of a Fluoropolymer Impregnated Non-Woven Glass Fabric Surface Coated with a Talc filed Thermosetting Resin Example 6 is repeated with the exception that the thermosetting resin contains a ceramic filler, kaolin. This example demonstrates that a ceramic filler can be used to reduce cost; x, y, and z coefficients of thermal expansion; and dielectric loss properties in high layer count multilayers and packages incorporating fine lines and spaces (multichip modules, ball grid array packages, and direct chip attach).

Example 8
Preparation of a Bond Ply Using a Fiberglass Composite Prepared using a Hot Roll Laminator Example 4 is repeated with the exception that the 106 style fiberglass is not fully impregnated with a PTFE dispersion. Two separate 1.0 mil skived PTFE films are pressed onto the two sides of a lightly PTFE coated 106 style fiberglass using a hot roll laminator operating at 375C. A thermosetting resin is applied according to the previously described procedures and a 4 layer multilayer PWB is prepared. This example demonstrates that a more cost effective method can be used to apply the PTFE component to the reinforcing component of the bond ply.

Example 9
Preparation of a Ceramic Filled Bond Ply Using a Fiberglass Composite Prepared from a Hot Roll Laminator Example 8 is repeated with the exception that the skived PTFE contains a ceramic filler. This example demonstrates that a ceramic filled PTFE film can be laminated onto a lightly coated fiberglass to increase key properties in a cost efficient manner.

Example 10
Preparation of a Bond Ply Using a Non-Woven Reinforcement Prepared using a Hot Roll Laminator Example 8 is repeated with the exception that a 1.5 mil film of poly(perfluorinated alkylvinylether-tetrafluoroethylene copolymer) is hot roll laminated into a non-woven polyaramide fabric creating a flat substrate. The bond ply is manufactured by sodium napthalene ething the sheet followed by application of the thermosetting resin as previously described. The 4 layer multilayer is prepared using the previously described procedures. This example demonstrates that a non-woven reinforced fluoropolymer composite can be prepared in a cost efficient manner by impregnating a nonwoven fabric with a melt flowable fluorinated polymeric film using a hot roll laminator.

Example 11
Preparation of a Bond Ply Using a Non-Woven Reinforcement

PBO staple and pulped fiber is added to a PTFE dispersion. The filled dispersion is then dipcoated in a multipass process onto a 5 mil polyimide carrier film using the temperature conditions outlined in Example 1. The PTFE coated non-woven substrate is then calendered to form a 2 mil flat sheet at 371° C. using a flame-heated hollow cylinder. The sheet is then consolidated from the polyimide carrier film. The sheet is then surface treated using a sodium naphthalene etching solution. The flat sheet is then surface coated with the thermosetting resin composition from Example 2. A 4 layer multilayer is built according to the procedure of Example 3. This example demonstrates that a laser drillable substrate containing PTFE can be prepared from a fiber filled PTFE dispersion yielding a thin low loss composite having controlled x, y, and z coefficient of thermal expansion values.

Example 12
Preparation of a Fluoropolymer Coated Non-Woven Fiber Glass Fabric

Non-woven fiberglass, 0.007 "and 0.015" thick respectively, (available from Lydal Manning as Manninglas® styles 1201 and 1200 respectively) was coated under low tension according to Example 1 to an 83 to 86% PTFE resin (available from I. E. DuPont) content using a 1.400 specific gravity PTFE aqueous dispersion at 1 to 8 fpm using a smooth metering rod. A subsequent top coat of PFA dispersion was coated onto the substrate using a 1.400 specific gravity at 3–5 fpm to a finished resin content of 88–91%. The surface of the composite is sodium naphthalene etched and coated with thermosetting resin according to the process described in Example 2. A 4 layer multilayer is prepared using the procedure outlined in Example 3. This examples demonstrates that a bond ply can be prepared from a non-woven substrate. That substrate has ample "good" electrical resin added in much fewer manufacturing steps. The non woven reinforecment is not a fiberglass matrix, therefore no glass fiber window "voids" from the weaving process exist which makes a woven product less homogeneous. This provides for a more uniform product that is suitable for high density interconnect packages such as: multichip modules, ball grid array packages, direct chip attach, and ultra fine lines and spaces. This example further demonstrates that a substrate can be produced that is well suited for laser drilling.

Example 13
Preparation of a Fluoropolymer Impregnated Non-Woven Fiber Glass Composite Using a Talc filled Epoxy as the Bonding Layer Example 12 is repeated except that the thermosetting resin of Example 5 is used to coat the non-woven substrate. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties. This example further demonstrates that a substrate can be produced that is well suited for laser drilling.

Example 14
Preparation of a Ceramic Filled Fluoropolymer Coated Non-Woven Fiber Glass Fabric Non-woven fiberglass, 0.007 "and 0.015" thick respectively, (available from Lydal Manning as Manninglas® styles 1201 and 1200 respectively) was coated under low tension according to Example 1. A 25 wt % loading of $TiO_2$ (Available from SCM. TIONA® RCS-9 rutile $TiO_2$ slurry) and 25 wt % of $SiO_2$ (available from ITC-$SiO_2$ with 0.5% A-187 fluorosurfactant as a surface treatment) was used by weight in a PFA (available from I. E. DuPont) aqueous dispersion. The ceramic filled dispersion was broken down with water to 1.400 specific gravity and coated from 0.5–2 fpm to achieve a total resin content of 80 to 90%. No top coating and the abundance of ceramic obviates the need for the etching process before the application of the thermosetting bonding layer. A 4 layer multilayer is prepared using the procedure outlined in Example 3. This examples demonstrates that a bond ply can be prepared from a non-woven substrate that is suitable for high density interconnect packages such as: multichip modules, ball grid array packages, direct chip attach, and ultra fine lines and spaces. This example further demonstrates that a substrate can be produced that is well suited for laser drilling. This example further demonstrates that with highly filled ceramic composites the chemical etching process is not always required.

Example 15
Preparation of a Ceramic Filled Fluoropolymer Impregnated Non-Woven Fiberglass Composite Using a Talc filled Epoxy as the Bonding Layer Example 14 is repeated except that the thermosetting resin of Example 5 is used to coat the non-woven base ply. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties. This example further demonstrates that a substrate can be produced that is well suited for laser drilling.

What is claimed is:

1. A process for fabricating a low loss multilayer printed circuit board comprising:
   a. providing at least one bonding ply comprising a first layer disposed on a second layer, said first layer comprising a thermosetting adhesive composition and said second layer is selected from a woven fabric substrate impregnated with at least one rubber, a non-woven fabric substrate impregnated with at least one rubber and a polymeric film having at least one rubber disposed thereon; and
   b. laminating together a plurality of printed circuit board layers by means of at least one bonding ply.

2. A process according to claim 1, wherein said bonding ply additionally comprises at least one metallization layer.

3. A process according to claim 1, wherein said thermosetting adhesive composition comprises an epoxy resin.

* * * * *